(12) United States Patent
Cheng et al.

(10) Patent No.: US 7,381,346 B2
(45) Date of Patent: Jun. 3, 2008

(54) THERMAL INTERFACE MATERIAL

(75) Inventors: Ching-Tai Cheng, Tu-Cheng (TW); Nien-Tien Cheng, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/521,918

(22) Filed: Sep. 15, 2006

(65) Prior Publication Data

US 2007/0131897 A1 Jun. 14, 2007

(30) Foreign Application Priority Data

Dec. 9, 2005 (CN) .......................... 200510102336

(51) Int. Cl.
*C09K 5/08* (2006.01)
*H05K 7/20* (2006.01)
*F28F 7/00* (2006.01)

(52) U.S. Cl. ............... 252/74; 165/10; 165/104.19; 165/104.33; 165/185; 252/70; 252/71; 257/720; 257/E23.08; 257/E23.087; 361/699; 361/704; 361/709; 508/150; 508/154; 508/165; 508/172

(58) Field of Classification Search .............. 165/10, 165/104.19, 104.33, 185; 252/70, 71, 74; 257/720, E23.08, E23.087; 361/699, 704, 361/709; 508/150, 154, 165, 172
See application file for complete search history.

(56) References Cited

U.S. PATENT DOCUMENTS

| 5,989,459 | A * | 11/1999 | Nguyen et al. ............. 252/503 |
|---|---|---|---|
| 6,238,596 | B1 * | 5/2001 | Nguyen et al. ............. 252/502 |
| 6,366,460 | B1 * | 4/2002 | Stone et al. ................. 361/687 |
| 6,372,337 | B2 | 4/2002 | Takahashi et al. |
| 6,610,635 | B2 * | 8/2003 | Khatri ......................... 508/161 |
| 6,651,736 | B2 * | 11/2003 | Chiu et al. ................... 165/185 |
| 6,653,741 | B2 * | 11/2003 | Sreeram et al. ............. 257/781 |
| 6,746,768 | B2 * | 6/2004 | Greinke et al. ............. 428/408 |
| 6,818,600 | B2 * | 11/2004 | Yamada et al. ............. 508/126 |
| 6,900,163 | B2 * | 5/2005 | Khatri ......................... 508/155 |
| 6,924,335 | B2 * | 8/2005 | Fan et al. .................... 524/495 |
| 6,956,739 | B2 * | 10/2005 | Bunyan ....................... 361/700 |
| 7,147,367 | B2 * | 12/2006 | Balian et al. ................. 374/44 |
| 7,183,003 | B2 * | 2/2007 | Leu et al. .................... 428/408 |
| 7,187,083 | B2 * | 3/2007 | Lewis et al. ................. 257/772 |
| 7,202,111 | B2 * | 4/2007 | Chiu ........................... 438/122 |
| 7,229,683 | B2 * | 6/2007 | Fischer et al. ........... 428/293.7 |
| 7,244,491 | B2 * | 7/2007 | Nguyen ....................... 428/323 |
| 7,253,523 | B2 * | 8/2007 | Dani et al. .................. 257/762 |
| 2002/0070445 | A1 * | 6/2002 | Tarter ......................... 257/714 |

* cited by examiner

*Primary Examiner*—Anthony J. Green
(74) *Attorney, Agent, or Firm*—Jeffrey T. Knapp

(57) ABSTRACT

A thermal interface material is for being applied to the contact surfaces to eliminate the air interstices between the heat dissipating apparatus and the electronic component in order to improve heat dissipation of the electronic component. The thermal interface material includes pentaerythritol oleate as base oil and fillers filled in the pentaerythritol oleate for improving the heat conductivity of the thermal interface material. The pentaerythritol oleate is used for holding the fillers therein and filling the air interstices to achieve an intimate contact between the heat dissipating apparatus and the electronic component. The fillers include aluminum powders, zinc oxide powders and zinc oxide nano-particles.

14 Claims, No Drawings

THERMAL INTERFACE MATERIAL

TECHNICAL FIELD

The present invention relates to a thermal interface material, and more particularly to a grease having an improved heat transfer ability for use with heat generating units.

BACKGROUND

With the fast development of the electronics industry, advanced electronic components such as CPUs (central processing units) are being made to have ever quicker operating speeds. During operation of the advanced electronic components, a larger amount of heat is generated. In order to ensure good performance and reliability of the electronic components, the operational temperature of the electronic components must be kept within a predetermined range. Generally, a heat dissipating apparatus such as a heat sink or a heat spreader is attached to a surface of the electronic component, so that the generated heat is dissipated from the electronic component to ambient air via the heat dissipating apparatus. However, the contact surfaces between the heat dissipating apparatus and the electronic component are rough and therefore are separated from each other by a layer of interstitial air, no matter how precisely the heat dissipating apparatus and the electronic component are brought into contact; thus, the interface thermal resistance is relatively high. A thermal interface material is preferred for being applied to the contact surfaces to eliminate the air interstices between the heat dissipating apparatus and the electronic component in order to improve the heat dissipation.

The thermal interface material includes silicone oil as base oil and fillers filled in the silicone oil. The silicone oil is used for filling the air interstices to achieve an intimate contact between the heat dissipating apparatus and the electronic component, whilst the fillers are used for improving the heat conductivity of the thermal interface material to thereby increase the heat dissipation efficiency of the heat dissipating apparatus. However, the amount of the fillers receivable in the silicone oil is limited since the holding capability of the silicone oil for the fillers is limited, so that the thermal conductivity of the grease is limited.

SUMMARY

The present invention is related to a thermal interface material for being applied to the contact surfaces to eliminate the air interstices between the heat dissipating apparatus and the electronic component in order to improve heat dissipation of the electronic component. The thermal interface material includes pentaerythritol oleate as base oil and fillers filled in the pentaerythritol oleate for improving the heat conductivity of the thermal interface material. The pentaerythritol oleate is used for holding the fillers therein and filling the air interstices to achieve an intimate contact between the heat dissipating apparatus and the electronic component. The fillers include metal powders, metal oxide powders and alloy powders. Furthermore, the fillers can include nano-particles.

Other advantages and novel features of the present invention will become more apparent from the following detailed description of preferred embodiments, in which:

DETAILED DESCRIPTION OF THE EMBODIMENTS

A thermal interface material according to a preferred embodiment of the present invention is a grease composition having a high thermal conductivity, and includes a base oil and fillers filled in the base oil. The fillers are metal powders, or metal oxide powders, or alloy powders to improve the heat conductivity of the thermal interface material. The base oil is pentaerythritol oleate. The pentaerythritol oleate is reactant of pentaerythritol and oil acid. At room temperature (about 25° C.) the pentaerythritol oleate is primrose yellow transparent liquid. A flash point of the pentaerythritol oleate is not higher than 310° C. The pH of the pentaerythritol oleate is no less than 1.0. The pentaerythritol oleate has excellent lubricating ability, high temperature stability, low volatility and low temperature fluidity. Usually the pentaerythritol oleate is used as base oil of metal-processing oil and fluid transmission oil. Since the pentaerythritol oleate has excellent lubricating ability, the powders added therein can move easily to fill an entire of the pentaerythritol oleate. The powders in the thermal interface material contact with each other, and the amount of the fillers receivable in the thermal interface material can be increased. Finally, the heat conductivity of the thermal interface material is improved since the thermal interface material according to the present invention can accommodate more fillers which are connected with each other.

Table 1 below shows heat resistances of thermal interface materials with different base oils. Nos. 1-3 show that the heat resistances of the present thermal interface materials using pentaerythritol oleate as base oil, whilst Nos. 4-6 show that the heat resistances of the conventional thermal interface materials using silicone oil as base oil. Nos. 1 and 4 use zinc oxide (ZnO) powders as fillers. The volumes of the ZnO powders of these two thermal interface materials are the same, being 35% of the thermal interface materials. However, the heat resistance of No. 4 using silicone oil as base oil is about 0.860(° C.·cm$^2$/W), which is larger than that of No. 1 which uses pentaerythritol oleate as base oil. The heat resistance of No. 1 which is one example of the present thermal interface material is only 0.252(° C.·cm$^2$/W). The ZnO powders of No. 1 have an average particle size of 0.4 μm, and a weight about 38.3112 g. The pentaerythritol oleate is about 11.6888 g. A ratio of weight of the ZnO powders to the pentaerythritol oleate is about 330:100.

Nos. 2 and 5 show the heat resistances of the thermal interface materials using aluminum (Al) powders as fillers. The volume of the Al powders is about 50%. The heat resistances of these two thermal interface materials are smaller than those of the two previous examples as shown in Nos. 1 and 4 for the high thermal conductivity of the Al powders. The heat resistance of the second example of the present thermal interface material shown in No. 2 is about 0.231(° C.·cm$^2$/W), whilst the heat resistance of the conventional thermal interface material of No. 5 using the same fillers as No. 2, but using silicone oil as base oil is about 0.263(° C.·cm$^2$/W). The Al powders in No. 2 have an average particle size about 2.0 μm, and a weight about 37.2928 g. The pentaerythritol oleate is about 12.7072 g. A ratio of weight of the Al powders to the pentaerythritol oleate is about 300:100.

Nos. 3 and 6 show the heat resistances of the thermal interface materials using a mixture of Al powders and ZnO powders as fillers. The volumes of the fillers of Nos. 3 and 6 are about 45% of the thermal interface materials. In these two kinds of thermal interface materials, the Al powders have an average particle size and a weight larger than that of the ZnO powders. The Al powders have an average particle size about 2.0 μm, whilst average particle size of the ZnO powders is about 0.4 μm. The weight of the Al powders is about 23.1476 g, and the ZnO powders are about 13.7171 g. The pentaerythritol oleate has a weight about 13.1353 g, and thus a ratio of weight of the filler powders to the pentaerythritol oleate is about 280:100. Also the heat resistance of the third example shown in No. 3 is smaller than that of the conventional thermal interface material shown in No. 6. As the fillers includes two kinds of powders which have different sizes, one kind of the powders having a relatively smaller particle size (such as ZnO powders of Nos. 3 and 6) can fill into the gaps of the other kind powders having a relatively larger particle size (such as Al powders of Nos. 3 and 6). Thus the gaps between the powders can be reduced, and the amount of the fillers accommodated in the thermal interface material can be increased.

TABLE 1

| No. | Base oil | Fillers | Volume of the filler | Heat resistance (° C. · cm²/W) |
|---|---|---|---|---|
| 1 | pentaerythritol oleate | ZnO | 35% | 0.252 |
| 2 | pentaerythritol oleate | Al | 50% | 0.231 |
| 3 | pentaerythritol oleate | Al + ZnO | 45% | 0.247 |
| 4 | Silicone oil | ZnO | 35% | 0.860 |
| 5 | Silicone oil | Al | 50% | 0.263 |
| 6 | Silicone oil | Al + ZnO | 45% | 0.265 |

As the size of the powders reduces, the gaps defined between the powders reduce and an area of the outer surfaces of the powders increases. In other words, the heat conductive area of the thermal interface material increases, and accordingly the heat conductivity of the thermal interface material is improved. Usually the average particle size of the Al powders is in a range of 0.1 to 10 μm, and the ZnO powders have an average particle size in a range of 0.1 to 5 μm. It is can be understood that the fillers can be selected from nano-particles having a diameter ranging from 1~100 nm. The nano-particles have a very small size, and thus the gaps between the powders can be very small.

Table 2 shows four kinds of thermal interface materials each having nano-particles therein. For example, No. 1 of table 2 shows a thermal interface material includes one part by weight of pentaerythritol oleate as base oil, and four parts by weight of fillers filled in the pentaerythritol oleate. The fillers include one part by weight of Al powder having an average particle size in a range of 0.1~10 μm, two parts by weight of ZnO powder having an average particle size in a range of 0.1~1.0 μm, and one part by weight of ZnO nano-particles having an average particle size in a range of 50~70 nm. A ratio of weigh of the ZnO nano-particles to the fillers in this example is 1:4. The ZnO nano-particles can fill into the gaps between the ZnO powders and Al powders, and thus the powders can contact with each other more closely. The heat conductivity of this thermal interface material is thus greatly improved. Furthermore, in this example, a ratio of weight of the ZnO nano-particles to the pentaerythritol oleate is 1:1.

TABLE 2

| | | Fillers | | | |
|---|---|---|---|---|---|
| No. | Base oil | Al (0.1~10 μm) | ZnO (0.1~1.0 μm) | ZnO (50~70 nm) | Heat resistance (° C. · cm²/W) |
| 1 | 1 | 1 | 2 | 1 | 0.14~0.17 |
| 2 | 1 | 2 | 2 | 1 | 0.11~0.13 |
| 3 | 1 | 3 | 1 | 1 | 0.06~0.08 |
| 4 | 1 | 3 | 2 | 1 | 0.08~0.10 |

As the fillers are used for improving the heat conductivity of the thermal interface material to thereby increase the heat dissipation efficiency of the heat dissipating apparatus, the more the fillers in the thermal interface material, the better heat conductivity the thermal interface material can achieve. Usually a ratio of weight of the fillers to the pentaerythritol oleate is not smaller than 2.8:1. However, the amount of the pentaerythritol oleate decreases with the increasing of the fillers. When the amount of the pentaerythritol oleate decreases to a too low level, the pentaerythritol oleate can not hold the fillers filled therein. Preferably, a ratio of weight of the pentaerythritol oleate to the fillers is not smaller than 1:12.

It is to be understood, however, that even though numerous characteristics and advantages of the present invention have been set forth in the foregoing description, the disclosure is illustrative only, and changes may be made in detail, and arrangement of portions within the principles of the invention to the full extent indicated by the broad general meaning of the terms in which the appended claims are expressed.

What is claimed is:

1. A thermal interface material for being applied to eliminate air interstices between a heat dissipating apparatus and an electronic component in order to improve heat dissipation of the electronic component, comprising:
   pentaerythritol oleate as base oil being used for filling the air interstices to achieve an intimate contact between the heat dissipating apparatus and the electronic component; and
   fillers filled in the pentaerythritol oleate for improving the heat conductivity of the thermal interface material.

2. The thermal interface material as described in claim 1, wherein a ratio of weight of the pentaerythritol oleate to the fillers is in a range of 1:2.8 to 1:12.

3. The thermal interface material as described in claim 2, wherein the ratio of weight of the pentaerythritol oleate to the fillers is not larger than 1:3.

4. The thermal interface material as described in claim 3, wherein the ratio of weight of the pentaerythritol oleate to the fillers is in a range of 1:5 to 1:12.

5. The thermal interface material as described in claim 1, wherein the fillers are selected from at least one of the following materials: metal powders, metal oxide powders and alloy powders.

6. The thermal interface material as described in claim 5, wherein the fillers are made of at least one of aluminum powders and zinc oxide powders.

7. The thermal interface material as described in claim 6, wherein the fillers are made of aluminum powders, and have an average particle size in a range of 0.1 μm to 10 μm.

8. The thermal interface material as described in claim 6, wherein the fillers are made of zinc oxide, and have an average particle size in a range of 0.1 μm to 5 μm.

9. The thermal interface material as described in claim 6, wherein the fillers are a mixture of the aluminum powders and the zinc oxide powders, and an average particle size and a weight of the aluminum powders are larger than those of the zinc oxide powders.

10. The thermal interface material as described in claim 5, wherein the fillers further comprise nano-particles having an average particle size in a range of 1~100 nm.

11. The thermal interface material as described in claim 10, wherein the average particle size of the nano-particles is in a range of 50~70 nm.

12. The thermal interface material as described in claim 11, wherein a ratio of weight of the nano-particles to the fillers is not larger than 1:4.

13. The thermal interface material as described in claim 11, wherein a ratio of weight of the nano-particles to the pentaerythritol oleate is 1:1.

14. The thermal interface material as described in claim 5, wherein the fillers consist of aluminum powders having an average particle size in a range of 0.1~10 μm, zinc oxide powders having an average particle size in a range of 0.1~1.0 μm, and zinc oxide nano-particles having an average particle size in a range of 50~70 nm.

* * * * *